United States Patent [19]
Cheung et al.

[11] Patent Number: 6,083,852
[45] Date of Patent: Jul. 4, 2000

[54] METHOD FOR APPLYING FILMS USING REDUCED DEPOSITION RATES

[75] Inventors: David Cheung, Foster City; Joe Feng, Santa Clara; Madhu Deshpande, San Jose; Wai-Fan Yau, Mountain View; Judy H. Huang, Los Gatos, all of Calif.

[73] Assignee: Applied Materials, Inc., Santa Clara, Calif.

[21] Appl. No.: 08/852,786

[22] Filed: May 7, 1997

[51] Int. Cl.[7] .................................................. H01L 21/469
[52] U.S. Cl. .......................... 438/791; 438/676; 359/586
[58] Field of Search .................................. 438/791, 636, 438/676; 359/586

[56] References Cited

U.S. PATENT DOCUMENTS

| | | |
|---|---|---|
| 3,990,100 | 11/1976 | Mamine et al. . |
| 4,257,832 | 3/1981 | Schwabe et al. . |
| 4,283,249 | 8/1981 | Ephrath . |
| 4,306,353 | 12/1981 | Jacobs et al. . |
| 4,468,413 | 8/1984 | Bachmann . |
| 4,634,496 | 1/1987 | Mase et al. . |
| 4,721,631 | 1/1988 | Endo et al. ................................ 427/66 |
| 4,791,073 | 12/1988 | Nagy et al. . |
| 4,849,366 | 7/1989 | Hsu et al. . |
| 4,910,122 | 3/1990 | Arnold et al. . |
| 4,946,550 | 8/1990 | Van Laarhoven . |
| 4,992,306 | 2/1991 | Hochberg et al. . |
| 5,068,124 | 11/1991 | Batey et al. . |
| 5,204,288 | 4/1993 | Marks et al. . |
| 5,286,667 | 2/1994 | Lin et al. . |
| 5,288,527 | 2/1994 | Jousse et al. . |
| 5,330,883 | 7/1994 | Garza . |
| 5,399,507 | 3/1995 | Sun . |
| 5,418,019 | 5/1995 | Chen et al. . |
| 5,436,463 | 7/1995 | Rostoker . |
| 5,480,687 | 1/1996 | Heming et al. . |
| 5,482,894 | 1/1996 | Havemann . |
| 5,492,736 | 2/1996 | Laxman et al. . |
| 5,500,279 | 3/1996 | Walter et al. . |
| 5,532,191 | 7/1996 | Nakano et al. . |

FOREIGN PATENT DOCUMENTS

| | | |
|---|---|---|
| 32 02 709 A1 | 8/1983 | Denmark ......................... C23C 11/00 |
| 0 299 245 A1 | 1/1989 | European Pat. Off. ........ C23C 16/34 |
| 0 588 087 A2 | 3/1994 | European Pat. Off. . |
| 0 588 087 A3 | 3/1994 | European Pat. Off. .......... G03F 7/09 |
| 1-18239 | 7/1989 | Japan . |
| 6-240459 | 8/1994 | Japan . |
| 7-201825 | 8/1995 | Japan . |
| 7-201716 | 8/1996 | Japan . |

OTHER PUBLICATIONS

Ogawa, Tohru et al., "SiOxNy:H, High Performance Anti–Reflective Layer for the Current and Future Optical Lithography," SPIE 1994, vol. 2197, pp. 722–732.

Maeda, et al., "Insulation degradation and anomalous etching phenomena in silicon nitride films prepared by plasma–enhanced deposition," *Thin Solid Films*, 112(3):279–288 (Feb. 17, 1984).

Budhani, R.C., et al., "Structural order in Si–N and Si–N–O films prepared by plasma assisted chemical vapor deposition process," *J. Vacuum Science and Technology/Section A*, 5(4):1644–1648 (Jul./Aug. 1987).

Stanley Wolf Silicon Processing for the VSLI Era vol. 2 Lattice Press pp. 327, 703, 1990.

Primary Examiner—Charles Bowers
Assistant Examiner—David S Blum
Attorney, Agent, or Firm—Townsend & Townsend & Crew

[57] ABSTRACT

This invention provides a stable process for depositing films which include silicon and nitrogen, such as antireflective coatings of silicon oxynitride. Nitrogen is employed to permit lower flow rates of the process gas containing silicon, thereby reducing the deposition rate and providing better control of film thickness. Additionally, the use of nitrogen stabilizes the process, improving film uniformity, and provides a higher-quality film. The invention is capable of providing more accurate and easier fabrication of structures requiring uniformly thin films containing silicon, nitrogen, and, optionally, oxygen, such as antireflective coatings.

19 Claims, 8 Drawing Sheets

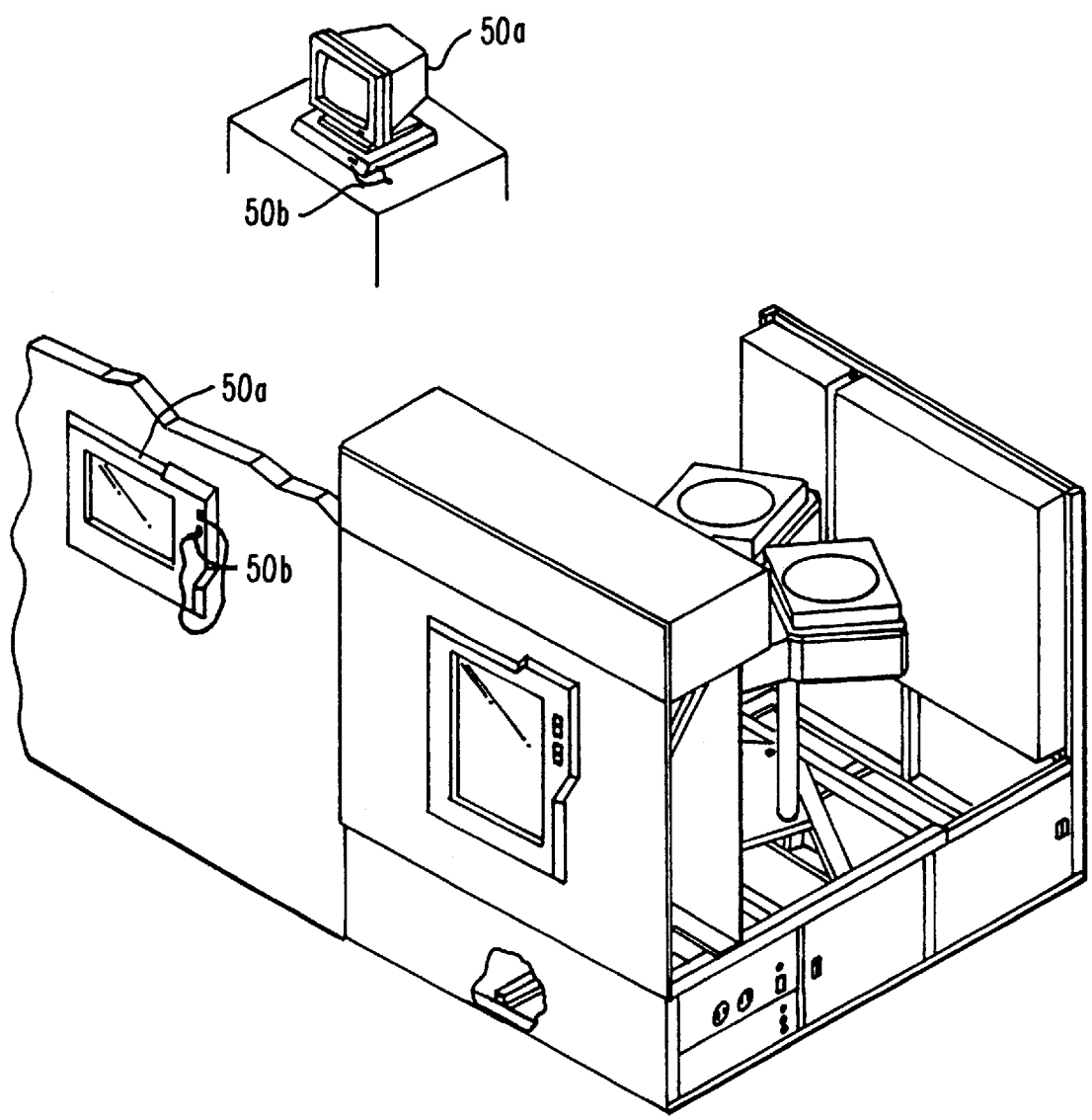
FIG. IE.

METHOD FOR APPLYING FILMS USING REDUCED DEPOSITION RATES

CROSS-REFERENCES TO RELATED APPLICATIONS

This application is related to patent application Ser. No. 08/672,888 entitled "METHOD AND APPARATUS FOR DEPOSITING ANTIREFLECTIVE COATING," having David Cheung, Joe Feng, Judy H. Huang, and Wai-Fan Yau as inventors; Application No 16301-009310/AMAT-1084-P2 entitled "METHOD AND APPARATUS FOR DEPOSITING AN ETCH STOP LAYER," having Judy H. Huang, Wai-Fan Yau, David Cheung, and Chan-Lon Yang as inventors; and Application No 16301-015100/AMAT-1530 entitled "IN SITU DEPOSITION OF A DIELECTRIC OXIDE LAYER AND ANTI-REFLECTIVE COATING," having David Cheung, Judy H. Huang, and Wai-Fan Yau as inventors. All of these applications are assigned to Applied Materials, Inc., the assignee of the present invention, and are hereby incorporated by reference.

BACKGROUND OF THE INVENTION

The present invention relates to an apparatus for, and the processing of semiconductor substrates. In particular, the invention relates to improving accuracy in the patterning of thin films during substrate processing via the deposition of antireflective coatings containing silicon (Si), nitrogen (N), and, optionally, oxygen (O) at low deposition rates, using nitrogen as a dilutant.

Since semiconductor devices were first introduced several decades ago, device geometries have decreased dramatically in size. During that time, integrated circuits have generally followed the two year/half-size rule (often called Moore's Law), meaning that the number of devices that will fit on a chip doubles every two years. Today's semiconductor fabrication plants routinely produce devices with feature sizes of 0.5 $\mu$m or even 0.35 $\mu$m, and tomorrow's plants will be producing devices with even smaller feature sizes.

A common step in the fabrication of such devices is the formation of a thin film on a substrate by the chemical reaction of gases. When patterning thin films, it is desirable that fluctuations in line width and other critical dimensions be minimized. Errors in these dimensions can result in variations in device characteristics or open-/short-circuited devices, thereby adversely affecting device yield. Thus, as feature sizes decrease, structures must be fabricated with greater accuracy. As a result, some manufacturers now require that variations in the dimensional accuracy of patterning operations be held to within 5% of the dimensions specified by the designer.

Thin films are often patterned by etching away portions of the deposited layer. To this end, modern substrate processing systems often employ photolithographic techniques in such patterning processes. Typically, these photolithographic techniques employ photoresist (PR) or other photosensitive material. In conventional photolithographic processing, photoresist is first deposited on a substrate. A photomask (also known simply as a mask) having transparent and opaque regions that embody the desired pattern is positioned over the photoresist. When the mask is exposed to radiant energy (e.g., light), the transparent portions permit the exposure of the photoresist in those regions, but not in the regions where the mask is opaque. The radiant energy causes a chemical reaction in exposed portions of the photoresist. A suitable chemical, chemical vapor or ion bombardment process is then used to selectively attack either the reacted or unreacted portions of the photoresist. This process is known as developing the photoresist. With the remaining photoresist acting as a mask, the underlying layer may then undergo further processing. For example, material may be deposited, the underlying layer may be etched or other processing carried out.

Modern photolithographic techniques often involve the use of equipment known as steppers, which are used to mask and expose photoresist layers. Steppers often use monochromatic (single-wavelength) radiant energy (e.g., monochromatic light), enabling them to produce the detailed patterns required in the fabrication of fine geometry devices. As a substrate is processed, however, the topology of the substrate's upper surface becomes progressively less planar. This uneven topology can cause reflection and refraction of the incident radiant energy, resulting in exposure of some of the photoresist beneath the opaque portions of the mask. As a result, this uneven surface topology can alter the patterns transferred by the photoresist layer, thereby altering critical dimensions of the structures fabricated.

Reflections from the underlying layer also may cause a phenomenon known as standing waves. When a photoresist layer is deposited on a reflective underlying layer and exposed to monochromatic radiant energy (e.g., deep ultraviolet (UV) light), standing waves may be produced within the photoresist layer. In such a situation, the reflected radiant energy interferes with the incident radiant energy and causes a periodic variation in intensity within the photoresist layer in the vertical direction. Standing-wave effects are usually more pronounced at the deep UV wavelengths used in modern steppers than at longer wavelengths because many commonly used materials are more reflective at deep UV wavelengths. The use of monochromatic light, as contrasted with polychromatic (e.g., white) light, also contributes to these effects because resonance is more easily induced in monochromatic light. The existence of standing waves in the photoresist layer during exposure causes roughness in the vertical walls formed when the photoresist layer is developed, which translates into variations in line widths, spacing, and other critical dimensions. To achieve the requisite dimensional accuracy, two approaches have been taken, both of which entail the use of another layer in addition to the photoresist layer.

The first approach uses a relatively thick organic film known as an antireflective coating (ARC), deposited beneath the photoresist, that absorbs incident radiant energy so that reflection and refraction of the incident radiant energy are minimized. A disadvantage of such organic films is that they require more process steps, and, being polymer-based, are difficult to etch.

A second approach helpful in achieving the necessary dimensional accuracy is the use of a dielectric antireflective coating (DARC), usually a thin layer of silicon oxynitride ($SiO_XN_Y$) or silicon nitride ($SiN_X$). The optical characteristics of a DARC are chosen to minimize the effects of reflections occurring at interlayer interfaces during the photolithography process. The DARC's absorptive index (k) is such that the amount of radiant energy transmitted in either direction is minimized, thus attenuating both transmitted incident radiant energy and reflections thereof. The DARC's refractive index (n) is matched to that of the associated photoresist material in order to reduce refraction of the incident radiant energy.

Such films may be formed, for example, by the chemical reaction of gases, a process referred to as chemical vapor deposition (CVD). Thermal CVD processes supply reactive gases to the substrate surface where, induced by high temperatures, chemical reactions take place to produce the desired film. In contrast, plasma-enhanced CVD (PECVD) processes promote excitation and/or disassociation of the reactant gases by the application of radio frequency (RF) energy to a reaction zone proximate to the substrate's surface, thereby creating a plasma of highly reactive species. The high reactivity of the released species reduces the energy (i.e., temperature) required for a chemical reaction to take place. These relatively low temperatures foster a more stable process and are therefore preferable when depositing a DARC.

The creation of DARCs necessitates the reliable control of optical and physical film parameters. These parameters normally include the film's refractive index (n), absorptive index (k), and thickness (t). A film's refractive and absorptive indices may be controlled by controlling the film's composition. For example, in a silicon oxynitride DARC, these indices may be altered by adding nitrogen-containing process gases.

Thickness, control of which is important in the deposition of many $SiN_x$ and $SiO_xN_y$ films, is a particularly important factor in determining the optical qualities of a DARC. Because a DARC uses interference to minimize reflected radiant energy, a DARC must be deposited to a thickness that provides the proper phase-shift of the radiant energy reflected from the lower surface. This cancellation may be accomplished by ensuring that light reflected at the DARC's lower surface (the interface between the DARC and the underlying layer) is 180 (or 540 or another odd multiple of 180) out-of-phase with respect to light reflected at the ARC's upper surface (the interface between the DARC and the photoresist layer). Preferably, the intensity of the two reflections are similar, to maximize interference (i.e., cancellation). Reflections from other interlayer interfaces (both above and below the DARC) may also contribute to the radiant energy reflected, and may thus need to be accounted for when optimizing ARC characteristics. A process for forming a DARC should therefore provide accurate control over the rate at which the DARC is deposited.

In the prior art, thickness control is provided by the introduction of an inert gas, such as helium or argon, into the substrate processing chamber during the deposition of a DARC. Introducing such gases into the processing chamber at relatively high rates allows the flow rates of reactant gases to be reduced. These reduced flow rates translate into a reduction in the amount of material available for deposition during a given period of time, thereby reducing the film's deposition rate. However, gases such as helium and argon are relatively expensive and are not universally available.

Accordingly, improved methods for controlling the deposition rate of a film, thereby providing finer control over the film's thickness, are constantly being sought. Preferably, such an improved method should not rely on the use of substances that may be expensive or difficult to obtain. Additionally, it is preferable that such a method allow the control of other film parameters, such as the film's refractive and absorptive indices.

SUMMARY OF THE INVENTION

The present invention addresses these requirements by providing an apparatus and a process for depositing a film containing silicon and nitrogen, such as a silicon oxynitride or silicon nitride film, while maintaining accurate control over the film's thickness. It is desirable to employ a low deposition rate to provide such control when depositing thin films such as DARCs. The invention provides apparatus and a process that uses nitrogen to lower the deposition rate of silicon oxynitride and silicon nitride CVD processes. The thickness of the deposited film is controlled by reducing the rate at which a silicon-containing process gas, such as silane ($SiH_4$), is introduced. This reduces the film's deposition rate to less than about 2000 Å/minute. To compensate for this, and so maintain acceptable process parameters, nitrogen is introduced into the processing chamber. This technique thus permits finer control over the deposited film's thickness. This is especially important in the creation of a DARC, which may be in the range of between about 200 Å and 3000 Å in thickness.

The present invention also provides equipment and process conditions under which parameters can be controlled to produce DARCs with various optimum refractive indices, absorptive indices and thicknesses to obtain the desired interference for different exposure wavelengths and substrates. According to one aspect of the present invention, an apparatus and process use silane, nitrous oxide ($N_2O$) and nitrogen to deposit a film according to the present invention. The ratio of silane to nitrous oxide is used to control the optical and chemical properties of the DARC deposited. The invention also teaches the use of nitrogen to allow reduced silane flow rates, thereby permitting a reduced deposition rate. The use of nitrogen is often more cost-effective than approaches that employ inert gases such as argon or helium.

The use of nitrogen also provides other benefits. The addition of nitrogen provides a more stable plasma, which improves film uniformity, as does the reduction in deposition rate. The reduced deposition rates provided by the present invention also reduce variations in film thickness between depositions (i.e., substrates). Furthermore, nitrogen allows for improved stress control in the deposited film. This helps prevent the film from becoming too tensile, which can cause it to flake off the substrate after deposition.

A further understanding of the nature and advantages of the present invention may be realized by reference to the remaining portions of the specification and the drawings.

BRIEF DESCRIPTION OF THE DRAWINGS

FIG. 1E is a simplified diagram of system monitor and CVD system 10 in a multichamber system, which may include one or more chambers;

DESCRIPTION OF THE SPECIFIC EMBODIMENTS

I. Introduction

The present invention is a method for fabricating dielectric antireflective coatings (DARCs) and other $SiO_xN_y$ or $SiN_x$ films requiring accurate control of film thickness. When deposited as a DARC, a film deposited according to the present invention provides more accurate transfer of an original mask pattern to the layer being patterned by reducing reflection and refraction of incident radiant energy in a photoresist layer used in the patterning process. The layer of the present invention can be deposited in deposition chambers of conventional design.

II. An Exemplary CVD System

Figure 1A:
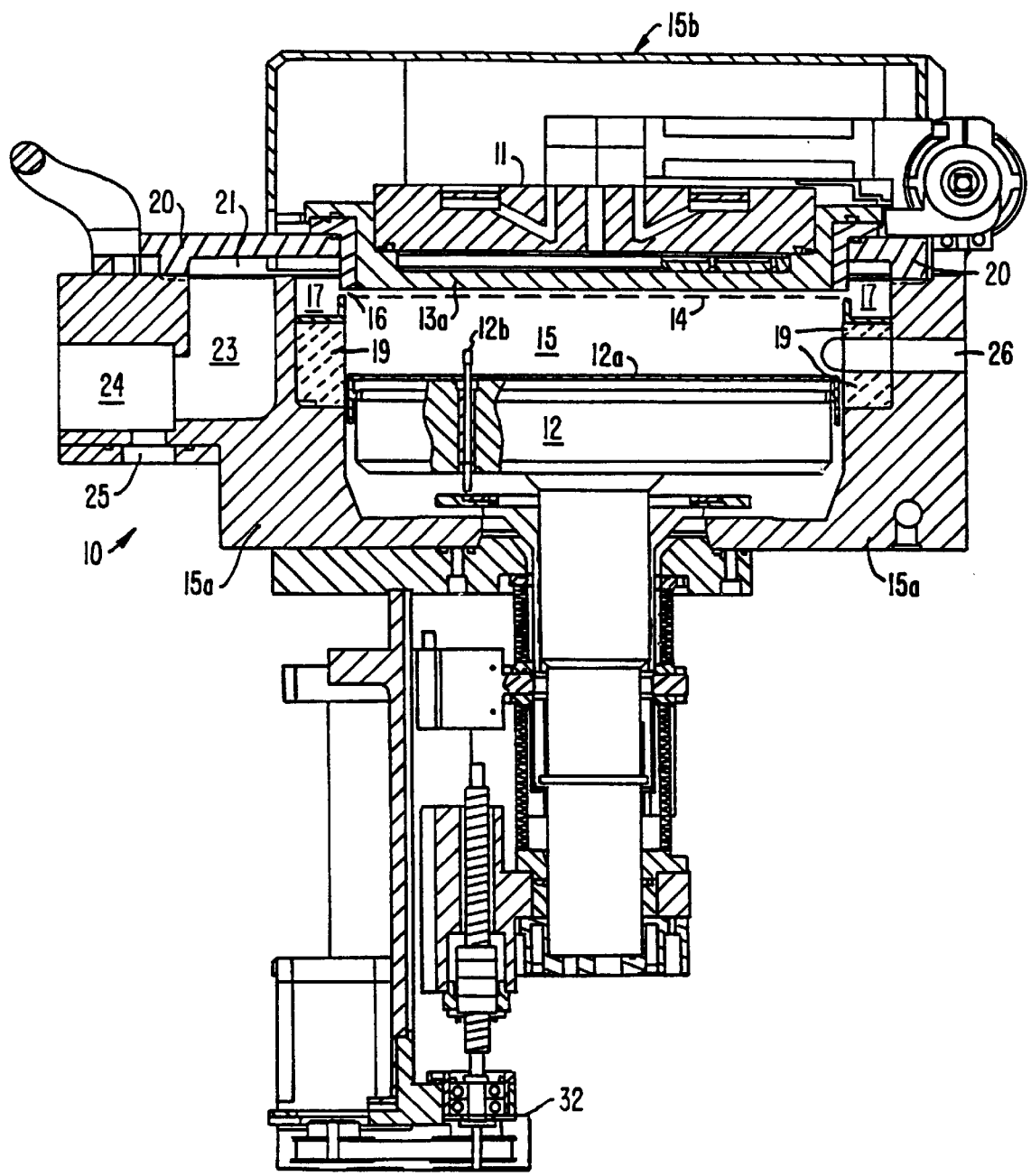
FIGS. 1A and 1B are vertical, cross-sectional views of one embodiment of a chemical vapor deposition apparatus according to the present invention.
Figure 1B:
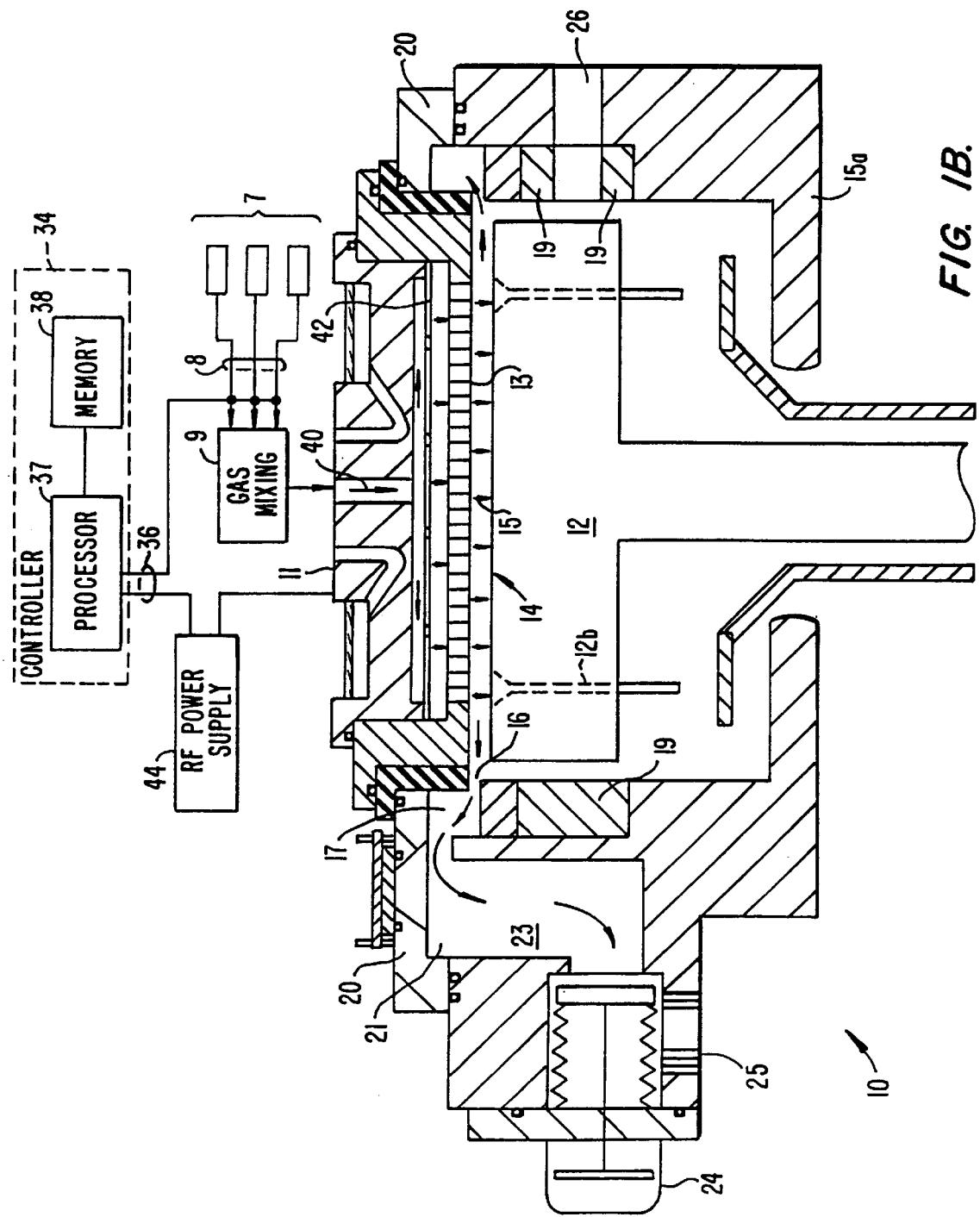
Figure 1C:
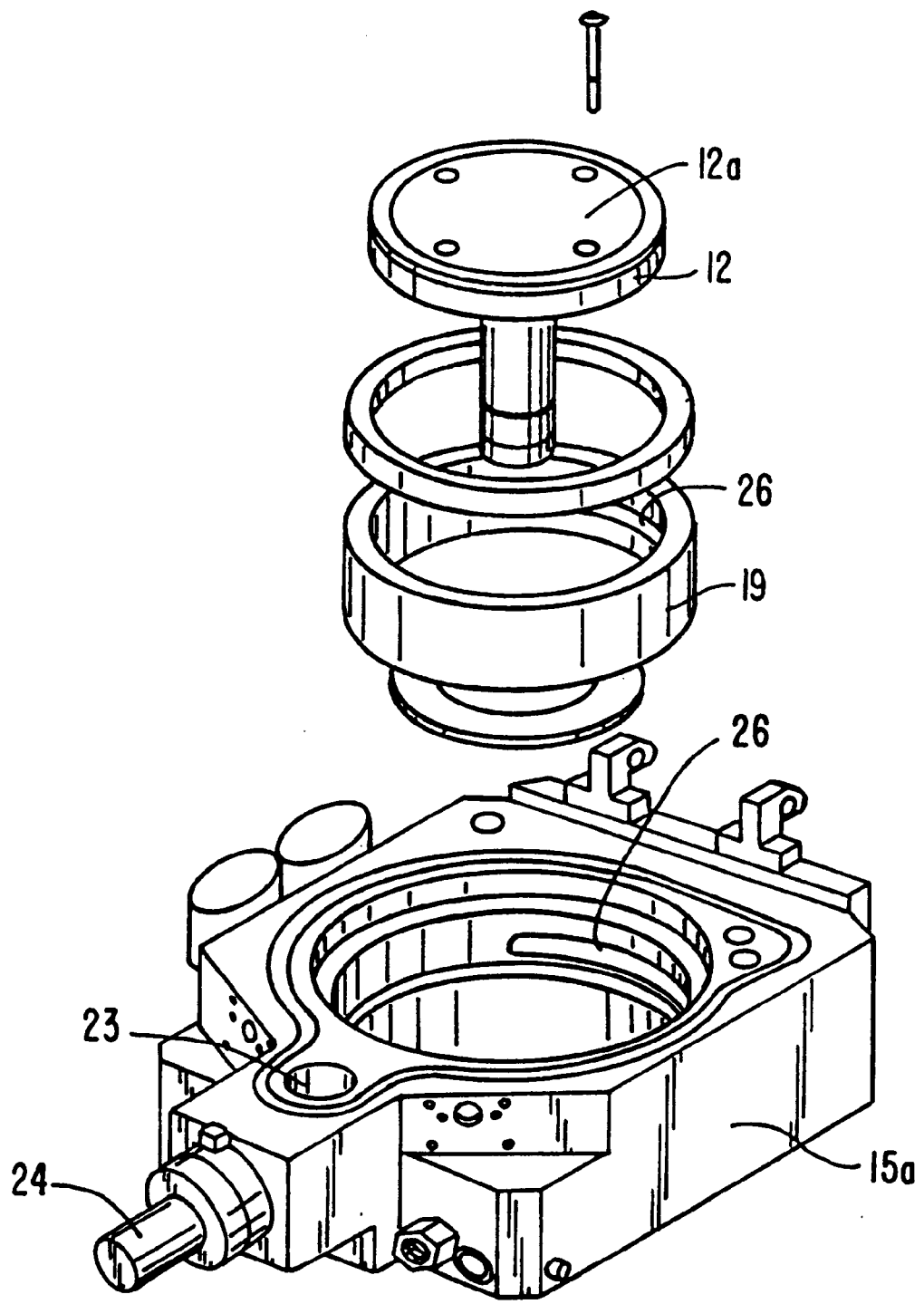
FIGS. 1C and 1D are exploded perspective views of parts of the CVD chamber depicted in FIG. 1A.
Figure 1D:
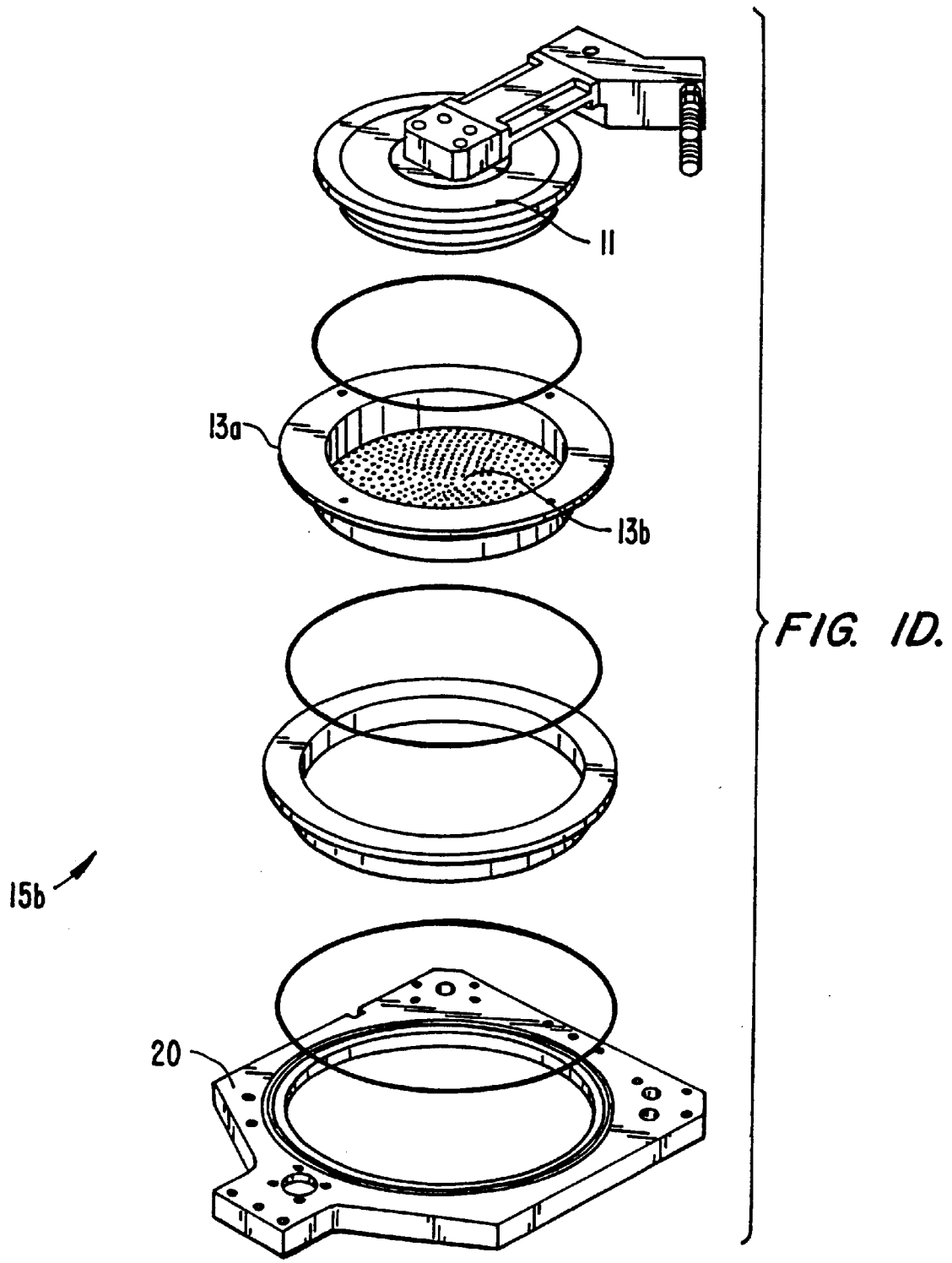

One suitable CVD system in which the method of the present invention can be carried out is shown in FIGS. 1A and 1B, which are vertical, cross-sectional views of a chemical vapor deposition system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

Reactor 10 contains a gas distribution manifold 11 for dispersing process gases to a substrate (not shown) that rests on a heated pedestal 12 centered within the process chamber. During processing, the substrate (e.g., a semiconductor wafer) is positioned on a flat (or slightly convex) surface 12a of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the substrates.

Deposition and carrier gases are introduced into chamber 15 through perforated holes 13b (FIG. 1D) of a conventional flat, circular gas distribution face plate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a. Before reaching the manifold, deposition and carrier gases are input from gas sources 7 through gas supply lines 8 into a mixing system 9 where they are combined and then sent to manifold 11. Generally, the supply line for each process gas includes (i) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the substrate supported on pedestal 12. RF power supply 44 is a mixed-frequency RF power supply that typically supplies power at a high RF frequency (RF1) of 13.56 MHz and at a low RF frequency (RF2) of 360 KHz to enhance the decomposition of reactive species introduced into the vacuum chamber 15.

During a deposition process, the plasma heats the entire process chamber 10, including the walls of the chamber body 15a surrounding the exhaust passageway 23 and the shut-off valve 24. When the plasma is not turned on, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products, and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360 circular symmetry and uniformity of the slot orifice 16 and the plenum 17 are important to achieving a uniform flow of process gases over the substrate so as to deposit a uniform film on the substrate.

From the exhaust plenum 17, the gases flow underneath a lateral extension portion 21 of the exhaust plenum 17, past a viewing port, through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The substrate support platter, of the pedestal 12 (preferably aluminum) is heated using a double full-turn single-loop embedded heater element configured to form parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum or anodized aluminum. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 32 raises and lowers the heater pedestal assembly 12 and its substrate lift pins 12b as substrates are transferred into and out of the body of the chamber by a robot blade (not shown) through an insertion/removal opening 26 in the side of the chamber 10. The motor 32 raises and lowers pedestal 12 between a processing position 14 and a lower, substrate-loading position. The motor, valves or flow controllers connected to the supply lines 8, gas delivery system, throttle valve, RF power supply 44, and chamber and substrate heating systems are all controlled by a system controller 34 over control lines 36, of which only some are shown. Controller 34 relies on feedback from optical sensors to determine the position of movable mechanical assemblies, such as the throttle valve and susceptor that are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard, which defines board, card cage, and connector dimensions and types. The VME standard also defines the bus structure as having a 16-bit data bus and 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment, two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer-readable programming language: for example, 68000 assembly language, C, C++, Pascal, Fortran or others. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1F:
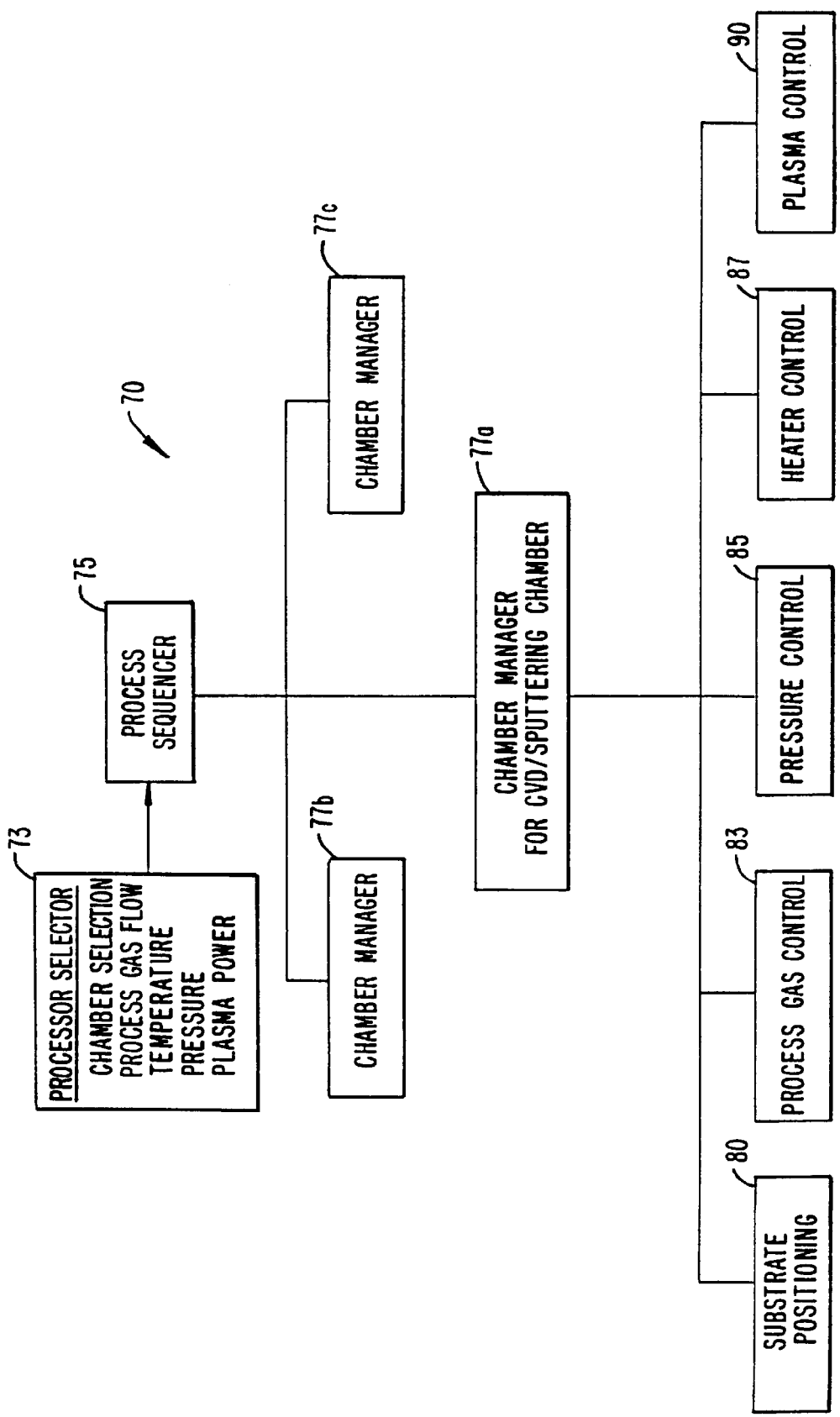
FIG. 1F shows an illustrative block diagram of the hierarchical control structure of the system control software, computer program 70, according to a specific embodiment.

FIG. 1F shows an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature, and are provided to the user in the form of a recipe. The parameters specified by the process recipe are entered utilizing the light pen/CRT monitor interface. The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c that controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next.

Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto the susceptor 12 and, optionally, to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example tetraethylorthosilane (TEOS), the process gas control subroutine 83 is written to include steps for bubbling a delivery gas, such as helium, through the liquid precursor in a bubbler assembly or introducing a carrier gas, such as helium, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping set-point pressure for the exhaust system 115. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, comparing the measured value(s) to the target pressure, obtaining PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in a susceptor 12, comparing the measured temperature with the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat the susceptor 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction-coupled RF high-density plasma CVD devices, or the like may be employed. Additionally, variations of the above-described system, such as variations in susceptor design, heater design, RF power frequencies, location of RF power connections and others are possible. For example, the substrate could be supported and heated by quartz lamps. The layer and method for forming such a layer of the present invention is not limited to any specific apparatus or to any specific plasma excitation method.

Figure 2:
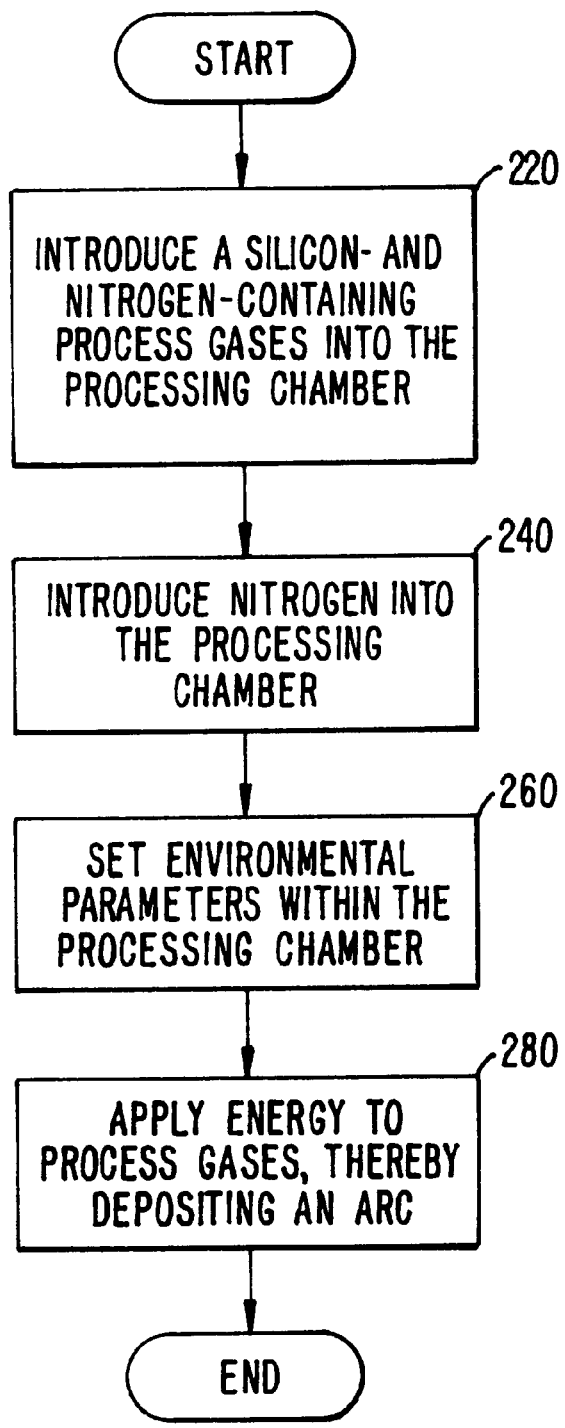
FIG. 2 is a flow diagram for the process of depositing a film according to the method of the present invention.

II. Deposition of a Silicon Oxynitride Film by the Method of the Present Invention FIG. 2 illustrates the steps performed in depositing a film according to the method of the present invention with the most preferable environmental parameters. The flow diagram is described in terms of the exemplary PECVD system shown in FIG. 1A. The process begins by positioning a substrate in vacuum chamber 15. First, process gases are introduced at step 220. In the deposition of a silicon oxynitride film (e.g., a DARC), these process gases preferably include silane and nitrous oxide. The silane may be introduced into vacuum chamber 15 at a rate of between about 5 sccm and 300 sccm, but preferably is introduced at a rate of about 50 sccm. The nitrous oxide may be introduced into vacuum chamber 15 at a rate of between about 5 sccm and 300 sccm, but preferably is introduced at a rate of about 50 sccm.

The low silane flow rate (relative to standard methods) is a key factor in the reduction of the deposition rate. With the silicon source's flow rate reduced, the deposition rate of the silicon oxynitride film is necessarily reduced. Silane is an attractive choice for depositing a film such as a silicon oxide film because of its availability. Also, the ability of some silane-based processes to deposit films over low melting-point metals is advantageous in applications that use such metals.

Next, nitrogen is introduced into vacuum chamber 15 via gas distribution manifold 11 at step 240. The nitrogen flow rate may vary between about 100 sccm and 4000 sccm, but is preferably about 1000 sccm. The preceding flow rates identified as preferable represent a mixture containing about 5% silane, 5% nitrous oxide and 90% nitrogen, by volume. This translates into a ratio of approximately 1:1:18 ($SiH_4:N_2O:N_2$), by volume. The addition of nitrogen facilitates the reduced deposition rate provided by the method of the present invention. Although nitrogen is a known carrier gas, its use in the present invention is to allow reduced flow rates and to provide a ready source of nitrogen for inclusion into the resulting film. Thus, nitrogen is both a dilutant gas and a reactant gas in this process (and so, by definition, is not inert).

As noted, the amount of silane used affects the deposition rate and physical properties of the film deposited. By maintaining the vacuum chamber's environmental parameters, the addition of nitrogen permits lower silane flow rates, thus lowering the film's deposition rate. This allows for greater control over film thickness, in addition to controlling the film's optical properties. The inclusion of nitrogen also helps to maintain the desired chamber pressure, thereby ensuring process stability.

The inclusion of nitrogen also provides greater uniformity in film thickness and improves film quality (e.g., films with greater resistance to moisture). According to the method of the present invention, reactant gases (other than nitrogen) need only be introduced at a rate sufficient to support the reaction, and not at the higher rate necessary to support the process itself (i.e., a plasma). Excess reactants are thus not introduced into the processing chamber and the reaction proceeds more evenly. For example, in the preferred embodiment described herein, the inclusion of nitrogen allows a reduction in the flow rates of silane and nitrous oxide. At step 260, environmental parameters within vacuum chamber 15 are established. Depending on the desired film characteristics, the spacing between supporter 12 and manifold 11 is set between about 200 mil and 650 mil, the substrate temperature is maintained between about 200° C. and 400° C., and the chamber pressure is maintained between about 1.0 torr and 6.0 torr. RF power supply 44 supplies RF energy to form a controlled plasma adjacent to the substrate at step 280. RF power supply 44 supplies a high frequency (e.g., 13.56 MHz) power ranging from between about 50 W and 500 W to manifold 11. This translates into an RF power density of between about 0.8 $W/cm^2$ and 8 $W/cm^2$, using the exemplary PECVD system A silicon oxynitride film is deposited by maintaining the aforementioned conditions.

The film's deposition rate is of particular note here. Traditional deposition techniques, such as PECVD using silane, for example, generally exhibit deposition rates above about 2000 Å/minute, and, more commonly, on the order of about between 4000–8000 Å/minute. A film deposited according to the method of the present invention may be deposited at a rate below about 2000 Å/minute. The method of the present invention is capable of deposition rates as low as about 500 Å/minute. These lower deposition rates translate into finer control over the deposited film's thickness than would otherwise be possible.

For example, a 1000 Å-thick DARC would require about 12.5 seconds to form using traditional methods, while depositing such a film using the method of the present invention requires about 80 seconds. A variation of only 1 second in deposition time translates to approximately a 8% change in thickness using the former method, while only about a 1.25% change is experienced using the latter method. Thus, a deposited film's thickness is less sensitive to variations in deposition time using the method of the present invention.

Not only are the higher deposition rates more difficult to accurately time, the effects of the time required to strike and extinguish the plasma used to deposit the film also become significant when depositing thin films at such deposition rates. These are not well-controlled regions of the deposition process, and generally contribute to inaccuracies in controlling film thickness and variation in film properties. Such deposition inaccuracies can cause an increase in deposition thickness and variations in thickness from one substrate to another. For example, the time required to strike a plasma may vary between about 1 second and 4 seconds, but is generally about 2 seconds. Thus, in the example above, the deposited film's uniformity may vary from substrate-to-substrate by as much as about 5% using traditional techniques. Using the method of the present invention, this substrate-to-substrate variation may be reduced to as little as 2%.

The process parameters and gas introduction rates described above are representative values for a resistively heated Centura DxZ Chamber manufactured by Applied Materials, Inc., outfitted to process 8-inch substrates. Other chamber sizes or chambers made by other manufacturers may have different values. As previously noted, other reactants (e.g., TEOS) and process parameters (e.g., other chamber pressures, substrate temperatures and nitrogen flow rates) may be used to control the deposition of a film according to the method of the present invention. Moreover, the nitrogen content of the resulting film may be altered by introducing certain reactants into the reaction which causes the film's deposition (e.g., ammonia). Similarly, the deposition rate of other films may also be controlled using the method of the present invention.

III. Theoretical Operation of a DARC and Exemplary DARC Parameters

Figure 3A:
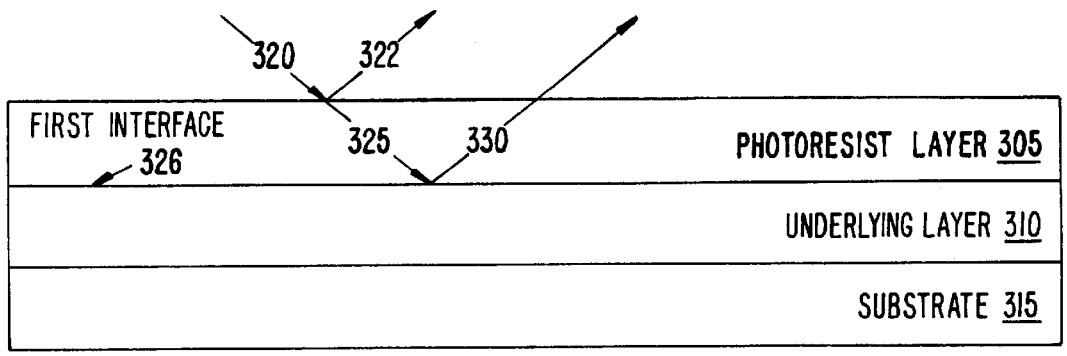
FIG. 3A is a vertical, cross-sectional view of paths of reflected and refracted radiant energy of a beam of incident radiant energy striking the surface of a multilayer structure during a photolithographic process.

FIG. 3A is a vertical, cross-sectional view of the reflection and refraction typically observed when a ray of light strikes the surface of a multilayer structure during photolithography. (The term "light" is used in place of the more general, but more cumbersome term "radiant energy.") As shown in FIG. 3A, a conventional photolithographic process creates a structure which includes a photoresist 305 applied over the layer to be processed, illustrated as an underlying layer 310. Underlying layer 310 will usually be formed over other layers or a substrate, exemplified in FIG. 3A by a substrate 315. However, substrate 315 may also be processed using such a process. Such processing may include steps such as etching, doping, oxide growth, or other process steps.

Once applied, photoresist 305 is illuminated as part of the process of forming a pattern therein. This illumination is exemplified in FIG. 3A by an incident light ray 320. A portion of incident light ray 320 is reflected from photoresist layer 305 as a first reflected light ray 322, while the remainder is transmitted through photoresist layer 305 as a first transmitted light ray 325. While a portion of first transmitted light ray 325 may be absorbed by photoresist layer 305, a significant portion reaches a first interface 326. The portion of transmitted light ray 325 reaching first interface 326 is reflected as a second reflected light ray 330.

This reflection can cause several problems. One possible problem is the scattering of transmitted light ray 325. If transmitted light ray 325 impinges on first interface 326 at anything other than a 90° angle, areas of photoresist layer 305 protected by the mask (not shown) may be unintentionally exposed. This might, for example, be caused by irregular topology in underlying layer 310 or incident light ray 320 impinging at an angle other than 90° to first interface 326.

Another possible problem is the creation of standing waves. Even if transmitted light ray 325 impinges on first interface 326 at a 90° angle at a point where first interface 326 is flat, transmitted light ray 325 and second reflected light ray 330 can interfere constructively and destructively with one another, creating standing waves (i.e., regions of varying intensity). This results in a rippled sidewall in photoresist layer 305 and an associated loss in resolution. The use of a DARC addresses these phenomena.

Figure 3B:
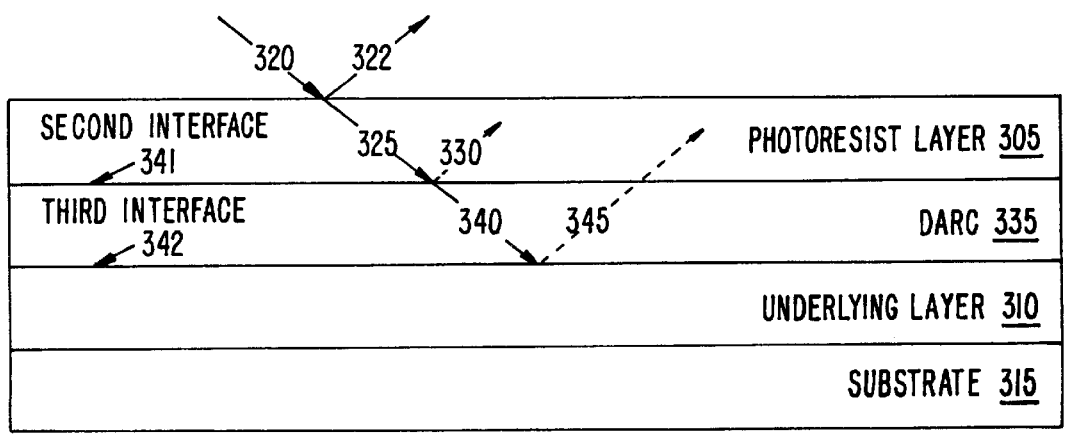
FIG. 3B illustrates the multilayer structure of FIG. 3A, further including a DARC fabricated according to the present invention, showing the effects of using such a DARC.

In FIG. 3B, a DARC 335 is included in the structure of FIG. 3A by deposition between photoresist layer 305 and underlying layer 310. The light paths in FIG. 3B illustrate the function of DARC 335. For simplicity, elements appearing in both FIGS. 3A and 3B are referred to using the same numbers. As shown, incident light ray 320 is again partially reflected by photoresist layer 305, creating first reflected light ray 322 and first transmitted light ray 325. However, with the addition of DARC 335, first transmitted light ray 325 is not only reflected as second reflected light ray 330, but is split into second reflected light ray 330 and a second transmitted light ray 340 at a second interface 341. Second transmitted light ray 340 travels through DARC 335 and is reflected at a third interface 342 as a third reflected light ray 345.

DARC 335 preferably causes second reflected light ray 330 and third reflected light ray 345 to be almost equal in intensity and have substantially opposing phase, so that they will substantially cancel each other. Hence, the only light exposing photoresist layer 305 is incident light ray 320. The reflected light rays' intensities are equalized by adjusting the absorption index of DARC 335, thereby varying the intensity of third reflected light ray 345. The phase difference between the reflected light rays is adjusted by varying the index of refraction of DARC 335. The appropriate thickness of DARC 335 is affected by both of these parameters.

More specifically, substantial cancellation between second reflected light ray 330 and third reflected light ray 345 can be achieved if the following two requirements are met simultaneously. First, the phase difference between the reflected light rays should be close to an odd multiple of 180°. Second, the intensity of the reflected light rays should be nearly identical. The first of the these requirements is described by the destructive interference equation, which is represented by Equation 1:

$$t = \frac{(m\lambda)}{4n} \quad (1)$$

where t is the DARC's thickness, m is the desired number of half-wavelengths the DARC's thickness is to represent (an odd number), $\lambda$ is the wavelength of the light use to expose the photoresist, and n is the refractive index of the DARC. The value of m sets the overall thickness of the DARC for incident light having a given wavelength. In other words, solutions for m=1 (180° phase difference), m=3 (540° phase difference), m=5 (900° phase difference) and higher odd multiples of 180° phase difference require an increasingly larger DARC thickness to satisfy Equation 1. The second equation:

$$I_{330} = I_{340} \quad (2)$$

describes the condition whereby the intensities of the reflected light rays, denoted as $I_{330}$ and $I_{340}$, are matched. This implies that their intensities are substantially equal, in the physical implementation.

For given structure, conditions 1 and 2 (as represented by Equations 1 and 2), can be satisfied simultaneously with appropriate choices of refractive index, absorptive index, and thickness of the DARC film. Variation of these parameters allows a DARC deposited in thicknesses ranging from about 200 Å to about 3000 Å using exposure wavelengths between about 190 nm and 900 nm. For example, an exposure wavelength of approximately 248 nm may be used when depositing of SiON films by PECVD techniques (i.e., an $SiO_XN_Y$ film, where X=Y=1). At this wavelength, a DARC deposited by this process can have a refractive index ranging from 1.7 to 2.9, and an absorptive index ranging from 0 to 1.3.

IV. Experimental Results

In simulations performed to determine preferable characteristics of DARCs used in various applications, structures including a DARC were simulated using a Prolitho simulator with Positive/Negative Resist Optical Lithography Model version 4.05a. The Prolitho software was used to simulate the exposure of several different multilayer structures (known as stacks) to deep UV radiant energy having a wavelength of 248 nm. Each of the stacks simulated included a DARC. Other simulation parameters included an exposure energy of 26 mJ and an exposure time of 80 seconds. The simulated photoresist approximated the characteristics of a layer of APEX E photoresist, 1000 nm (1 μm) in thickness.

The multilayer structures simulated were analogous to that illustrated in FIG. 3B. Several materials were used as both overlying and underlying layers. The results of these simulations are summarized in Table 1.

TABLE 1

Preferable Optical Parameters for Simulated Multilayer Structures.

| Stack Composition | n (unitless) | k (unitless) | t (in Å) | Exposure Wavelength (nm) |
|---|---|---|---|---|
| DARC/$SiN_x$/$SiO_x$/$WSi_x$/Poly | 2.75 | 0.55 | 310 | 365 |
| DARC/α-Poly/$SiO_x$/$WSi_x$/Poly | 2.64 | 0.44 | 310 | 365 |
| DARC/$SiO_x$/$WSi_x$/Poly | 2.7 | 0.5 | 640 | 365 |
| DARC/Aluminum | 2.83 | 0.9 | 255 | 365 |

TABLE 1-continued

Preferable Optical Parameters for Simulated Multilayer Structures.

| Stack Composition | n (unitless) | k (unitless) | t (in Å) | Exposure Wavelength (nm) |
|---|---|---|---|---|
| SiO$_x$/DARC/SiO$_x$/Poly | 2.5 | 0.35 | 1000 | 365 |
| DARC/SiO$_x$/SiN$_x$ (Deep Trench Stack) | 2.15 | 0.54 | — | 248 |
| DARC/SiO$_x$/SiN$_x$ (Contact Etch) | 2.15 | 0.54 | — | 248 |
| DARC/TiN/Al | 2.15 | 0.54 | 300 | 248 |

In the simulated structures, oxide layers are represented by silicon oxide (SiO$_X$; also known as undoped silicate glass or USG). Various other oxides may be used in these layers, either alone or in combination, although oxides other than those based on silicon oxide may require different DARC characteristics to minimize substrate reflectivity. Layers of borosilicate glass (BSG; silicon oxide doped with boron) and borophosphosilicate glass (BPSG; silicon oxide doped with boron and phosphorus) were treated as possessing optical characteristics substantially identical to a USG layer of similar thickness, since the refractive indices of these substances are similar. Thus, no delineation is made between such layers in the composition of the underlying oxide layer, for purposes of the simulations discussed herein. Layers consisting of a nitride are represented by silicon nitride (SiN$_X$). Again, different nitrides may be used, but may require different DARC characteristics to minimize substrate reflectivity.

The first stack simulated consisted of a DARC, silicon nitride, silicon oxide, tungsten silicide (WSi$_X$) and polysilicon layers (listed from top-most layer to bottom-most layer). Substrate reflectivity was found to be sensitive to the thickness of the nitride layer. Optimally, the nitride layer was 150 nm in thickness, yielding a substrate reflectivity approaching 0%. However, for variations of about 33% in nitride layer thickness, the simulation predicted a rise in substrate reflectivity to over 40%. Even for variations in nitride layer thickness of only 10%, substrate reflectivities might be expected to be as much as about 20%. Thus nitride layer thickness is an area of concern when manufacturing such a structure.

The second stack simulated consisted of a DARC, α-polysilicon, silicon oxide, tungsten silicide and polysilicon layers (again listed from top-most layer to bottom-most layer). Substrate reflectivity was found to fall from a high of 40% (at a thickness of 0 μm) as the α-polysilicon layer's thickness increased. As the α-polysilicon layer's thickness approached 30 nm (300 Å), the substrate reflectivity went to nearly 0% and remained so after that point (the α-polysilicon layer's thickness was only simulated up to 1000 Å, however). This indicated that once the α-polysilicon layer's thickness was equal to or greater than 300 Å, the layers underlying the α-polysilicon layer could be ignored for purposes of this analysis. Applications for a stack of this type include a dual oxide/nitride structure.

The third stack simulated consisted of a DARC, silicon oxide, tungsten silicide and polysilicon layers (again listed from top-most layer to bottom-most layer). Substrate reflectivity was found to vary periodically with the oxide layer's thickness. It was estimated that minimums would be experienced approximately every additional 120 nm, starting at 80 nm (i.e., at 80 nm, 200 nm, 320 nm and so on), although this stack was only simulated for oxide thicknesses of between 100 nm and 300 nm. Variations of up to 10% in the oxide layer's thickness were found to cause increases in substrate reflectivity of less than about 1%.

The fourth stack simulated consisted of a DARC and an aluminum layer (again listed from top-most layer to bottom-most layer). Because aluminum is impenetrable to the wavelengths of radiant energy used in photolithography processes, the composition of layers underlying the aluminum layer is immaterial to this analysis. As noted in Table 1, simulations indicated an optimal DARC thickness of 255 Å.

The fifth stack simulated consisted of a first silicon oxide layer, a DARC, a second silicon oxide layer and a polysilicon layer (again listed from top-most layer to bottom-most layer). By simulating various first and second silicon oxide layer thicknesses, optimal thickness values of 8400 Å for the first silicon oxide layer and 12350 Å for the second silicon oxide layer were determined. Optimization of these thickness values permitted tuning of the DARC's characteristics for minimal substrate reflectance and high resistivity (on the order of $9.5 \times 10^9$ ω). As shown in Table 1, this stack used a DARC having a thickness of 1000 Å, and n and k values of 2.5 and 0.35, respectively.

Prolitho simulations were also performed to determine optimal optical properties of Deep Trench Stack (DTS; the sixth layer simulated) and Contact Etch Stack (CES; the seventh layer simulated). DTS structures are often used in improving the isolation of integrated devices such as memory cells, thereby reducing the possibility of device latch-up. The DTS simulated consisted of a DARC, silicon oxide and silicon nitride layers (listed from top-most layer to bottom-most layer). As shown in Table 1, the simulations suggested that the optimal values for the DTS application would be: n=2.15 and k=0.5, to achieve a substrate reflectivity of less than 5%. A stack incorporating this DARC will accommodate a ±200 Å variation in silicon oxide layer thickness and a ±75 Å variation in DARC thickness without affecting substrate reflectivity appreciably. The thickness of the silicon oxide layer and the silicon nitride layer may be varied ±175 Å and ±100 Å, respectively, without experiencing a variation in substrate reflection of more than 3%.

The CES simulated consisted of a DARC, silicon oxide and silicon nitride layers (listed from top-most layer to bottom-most layer). CES structures are used in applications such as the creation of contacts between a metal layer and a doped well, a guard ring or a polysilicon layer. As also shown in Table 1, the optimal optical values for the CES application were found to be: n=2.15 and k=0.54, to achieve a substrate reflectivity of less than 5%. The preceding n and k values are for a DARC fabricated according the method of the present invention and tuned for deep UV applications (i.e., radiant energy at a wavelength of 248 nm). A variation of ±250 Å in silicon oxide layer thickness and a ±100 Å in DARC thickness can be accommodated using this structure. The thickness of the silicon oxide layer and the silicon nitride layer can vary ±200 Å and ±200 Å, respectively, again without experiencing a variation in substrate reflection of more than 3%.

Along with the previously noted simplifying assumptions regarding oxide layer composition, a further simplifying assumption was made regarding the simulations of the DTS and CES structures described above. Because they could not be expected to alter the DES's and CES's optical qualities appreciably, the oxide layer normally formed underneath the nitride layer of a DTS (nominally 50 Å in thickness) and a CES (nominally 80 Å in thickness) was not accounted for in the simulations performed. This is a fair assumption because incident radiant energy of the kind used in photolithography would not, for these stacks, be expected to penetrate the oxide and nitride layers underlying the DARC.

The eighth stack simulated consisted of a DARC, a titanium nitride (TiN) layer and an aluminum layer (again listed from top-most layer to bottom-most layer). This is a good example of a nitride layer that does not contain silicon, the use of which was noted previously. Because aluminum is impenetrable to the wavelengths of radiant energy used in photolithographic processes, the composition of layers underlying the aluminum layer is immaterial to this analysis. As noted in Table 1, good results were exhibited for a DARC thickness of 300 Å (i.e., minimal substrate reflectivity).

The suggested combinations of DARC optical properties and thicknesses are capable of yielding substrate reflectivities below 5% in all of the stacks described herein. A DARC according to the present invention also minimizes substrate reflections and enhances linewidth accuracy even when the underlying topography and DARC experience variations in thickness. The simple inclusion of a DARC fabricated according to the present invention may reasonably be expected to limit substrate reflectivity to less than about 8%, notwithstanding changes in underlying topography. These reflections can exceed 50% when a DARC is not employed.

The method of the present invention is not intended to be limited by the specific parameters set forth in the above experiments. A person of ordinary skill in the art will realize that different processing conditions and different reactant sources can be used without departing from the spirit of the invention. Other equivalent or alternative methods of depositing silicon oxynitride and silicon nitride films according to the present invention will be apparent to those skilled in the art. For example, although silane and nitrous oxide are used in a preferred embodiment, other gases containing silicon and nitrogen may also be employed. These equivalents and alternatives are intended to be included within the scope of the present invention.

What is claimed is:

1. A process for depositing an antireflective film comprising silicon and nitrogen over a substrate disposed in a processing chamber, said process comprising the steps of:
   introducing a first process gas comprising silicon into the processing chamber at a first selected rate, said first selected rate causing said film to be deposited at less than about 2000 Å/minute;
   introducing nitrogen ($N_2$) (into the processing chamber as both a dilutant gas and a reactant gas at a second selected rate which maintains a pressure in the processing chamber sufficient to permit a reaction including said first process gas and said nitrogen to proceed, said pressure being between about 1 torr and about 6 torr; and
   applying energy to said first process gas and said nitrogen to cause said reaction to deposit said film comprising silicon and nitrogen to a desired thickness.

2. The method of claim 1 wherein said film is deposited at a rate of between about 500 Å/minute and about 1500 Å/minute.

3. The method of claim 1 wherein said first process gas comprises silane.

4. The method of claim 1 further comprising the step of:
   introducing a second process gas comprising an oxygen-containing compound into the processing chamber.

5. The method of claim 4 wherein said first process gas comprises silane and said second process gas comprises nitrous oxide.

6. A process for depositing an antireflective film comprising silicon, oxygen, and nitrogen over a substrate disposed in a processing chamber, said process comprising the steps of:

introducing a first process gas comprising silicon into the processing chamber at a first selected rate, said first selected rate causing said film to be deposited at less than about 2000 Å/minute;
introducing a second process gas comprising oxygen into the processing chamber;
introducing nitrogen ($N_2$) into the processing chamber as both a dilutant gas and a reactant gas at a second selected rate which maintains a pressure in the processing chamber sufficient to permit a reaction including said first process gas, said second process gas, and said nitrogen to proceed, said pressure being between about 1 torr and about 6 torr; and
applying energy to said first process gas, said second process gas, and said nitrogen to cause said reaction to deposit said film comprising silicon, oxygen, and nitrogen to a thickness enabling said film to reduce reflection and refraction of incident radiant energy within a second film, said second film being formed over said film and said incident radiant energy altering the solubility of regions of said second film exposed to said incident radiant energy with respect to a developer used to develop said second film.

7. The method of claim 6 wherein said first process gas comprises silane and said second process gas comprises nitrous oxide.

8. The method of claim 7 further comprising the step of:
   heating the substrate to a temperature of between about 200° C. and about 400° C.

9. The method of claim 7 wherein said energy applied is RF energy and said RF energy generates a plasma from said first process gas, said second process gas, and said nitrogen.

10. The method of claim 9 wherein an RF power density of said plasma is between about 0.8 W/cm$^2$ and about 8 W/cm$^2$.

11. The method of claim 7 wherein said second selected rate is between about 500 sccm and about 4000 sccm.

12. The method of claim 11 wherein said first selected rate is between about 5 sccm and about 300 sccm and said nitrous oxide is introduced into said processing chamber at a rate of between about 5 sccm and about 300 sccm.

13. The method of claim 12 wherein the ratio of silane to $N_2O$ is about 1:1.

14. The method of claim 7 wherein said period is such that said film is deposited to a thickness of between about 200 Å and about 3000 Å.

15. The method of claim 7 further comprising the step of varying a nitrogen content of said film to cause said film to exhibit a refractive index in the range of 1.7–2.9 and an absorptive index in the range of 0–1.3.

16. The method of claim 7, wherein said incident radiant energy has a wavelength of between about 190 nm and about 900 nm.

17. A process for depositing an antireflective film comprising silicon, oxygen, and nitrogen on a substrate disposed in a processing chamber, comprising the steps of:
   introducing silane into the processing chamber at a rate of between about 5 sccm and about 300 sccm, thereby causing said film to be deposited at less than about 2000 Å/minute;
   introducing nitrous oxide into said chamber at a rate of between about 5 sccm and about 300 sccm;
   introducing nitrogen ($N_2$) into the processing chamber as both a dilutant gas and a reactant gas at a rate of between about 500 sccm and about 4000 sccm to maintain a pressure in said chamber of between about 1 torr and about 6 torr, thereby permitting a reaction including said silane, said nitrous oxide, and said nitrogen to proceed;

heating the substrate to between about 200° C. and about 400° C.;

applying RF power to said silane, said nitrous oxide and said nitrogen to form a plasma from said silane to deposit said film comprising silicon, oxygen, and nitrogen to a desired thickness, said nitrous oxide and said nitrogen at an RF power density of between about 0.8 W/cm$^2$ and about 8 W/cm$^2$.

18. The method of claim 17 wherein said desired thickness is between about 200 Å and about 1000 Å.

19. The method of claim 17 further comprising the step of varying a nitrogen content of said film to cause said film to exhibit a refractive index in the range of 2.1–2.9 and an absorptive index in the range of 0.2–0.9.

* * * * *